United States Patent
Fell et al.

(10) Patent No.: US 12,351,451 B2
(45) Date of Patent: Jul. 8, 2025

(54) FABRICATION OF MEMS STRUCTURES FROM FUSED SILICA FOR INERTIAL SENSORS

(71) Applicant: Atlantic Inertial Systems Limited, Plymouth (GB)

(72) Inventors: Christopher Paul Fell, Cheltenham (GB); Ian Michael Sturland, Bristol (GB); Tracey Ann Hawke, Bristol (GB)

(73) Assignee: ATLANTIC INERTIAL SYSTEMS LIMITED, Plymouth (GB)

( * ) Notice: Subject to any disclaimer, the term of this patent is extended or adjusted under 35 U.S.C. 154(b) by 289 days.

(21) Appl. No.: 17/892,443

(22) Filed: Aug. 22, 2022

(65) Prior Publication Data
US 2023/0067030 A1 Mar. 2, 2023

(30) Foreign Application Priority Data
Aug. 24, 2021 (EP) .................................. 21275116.8

(51) Int. Cl.
*B81B 3/00* (2006.01)
*B81C 1/00* (2006.01)
(Continued)

(52) U.S. Cl.
CPC ........ *B81B 3/0072* (2013.01); *B81C 1/00666* (2013.01); *G01C 19/5684* (2013.01);
(Continued)

(58) Field of Classification Search
CPC ............ G01C 19/5684; G01C 19/5755; G01C 19/5769; B81B 2201/0242;
(Continued)

(56) References Cited

U.S. PATENT DOCUMENTS 7,958,781 B2    6/2011   Fell
8,327,684 B2   12/2012   Denatale et al.
(Continued)

FOREIGN PATENT DOCUMENTS

CN     109848569 A    6/2019
EP       2799814 A1   11/2014
(Continued)

OTHER PUBLICATIONS

Abstract of CN109848569 (A), Published: Jun. 7, 2019, 1 page.
(Continued)

*Primary Examiner* — Marcos D. Pizarro
*Assistant Examiner* — Thomas W McCoy
(74) *Attorney, Agent, or Firm* — CANTOR COLBURN LLP

(57) ABSTRACT

A method for forming a MEMS structure for an inertial sensor from fused silica includes: depositing a conductive layer on one or more selected regions of a first surface of a fused silica substrate, and illuminating areas of the fused silica substrate with laser radiation in a pattern defining features of the MEMS structure for an inertial sensor. A masking layer is deposited at least on the one or more selected regions of the first surface of the fused silica substrate where the conductive layer has been deposited, such that the illuminated areas of the fused silica substrate remain exposed. A first etch of the exposed areas of the fused silica substrate is performed so as to selectively etch the pattern defining features of the MEMS structure for an inertial sensor.

7 Claims, 9 Drawing Sheets

(51) Int. Cl.
*G01C 19/5684* (2012.01)
*G01C 19/5755* (2012.01)
*G01C 19/5769* (2012.01)

(52) U.S. Cl.
CPC ..... *G01C 19/5755* (2013.01); *G01C 19/5769* (2013.01); *B81B 2201/0242* (2013.01); *B81C 2201/013* (2013.01); *B81C 2201/0132* (2013.01); *B81C 2201/0133* (2013.01); *B81C 2201/0143* (2013.01); *B81C 2201/0198* (2013.01); *B81C 2203/031* (2013.01); *B81C 2203/032* (2013.01)

(58) Field of Classification Search
CPC ........ B81B 2203/032; B81C 2201/013; B81C 2201/0132; B81C 2201/0133; B81C 2201/0143
See application file for complete search history.

(56) References Cited

U.S. PATENT DOCUMENTS

| | | | |
|---|---|---|---|
| 8,555,717 | B2 | 10/2013 | Fell et al. |
| 8,601,872 | B2 | 12/2013 | Ikeda et al. |
| 9,576,773 | B2 | 2/2017 | Huff et al. |
| 9,709,401 | B2 | 7/2017 | Fell |
| 2011/0167911 | A1* | 7/2011 | Fell ................. G01C 19/5684 73/504.12 |
| 2014/0283602 | A1 | 9/2014 | Yamamoto |
| 2018/0231382 | A1* | 8/2018 | Malvern ............ G01C 19/5684 |
| 2019/0242708 | A1* | 8/2019 | Townsend ......... G01C 19/5783 |
| 2020/0200536 | A1* | 6/2020 | Williamson ....... G01C 19/5726 |
| 2022/0090917 | A1* | 3/2022 | Najafi ................. G01C 19/005 |

FOREIGN PATENT DOCUMENTS

| | | |
|---|---|---|
| WO | 2010114775 A1 | 10/2010 |
| WO | 2017025752 A1 | 2/2017 |

OTHER PUBLICATIONS

Bellouard Yves: "Femtosecond laser-based production of 3D micro- and nano-devices in transparent substrate: a step toward system-materials", Proceedings of SPIE, IEEE, US, vol. 9351, Mar. 11, 2015 (Mar. 11, 2015), pp. 93510G-93510G.

European Search Report for Application No. 21275116.8, mailed Feb. 2, 2022, 24 pages.

Lenssen and Bellouard, "Optically transparent glass micro-actuator fabricated by femtosecond laser exposure and chemical etching" Appl. Phys. Lett. 101, 103503 (2012); 5 Pages.

* cited by examiner

FABRICATION OF MEMS STRUCTURES FROM FUSED SILICA FOR INERTIAL SENSORS

CROSS-REFERENCE TO RELATED APPLICATIONS

This application claims priority to European Patent Application No. 21275116.8 filed Aug. 24, 2021, the entire contents of which is incorporated herein by reference.

TECHNICAL FIELD

The present disclosure relates to MEMS structures for inertial sensors formed from fused silica, and fabrication methods thereof.

BACKGROUND

MEMS inertial sensors are most commonly fabricated from silicon wafer substrates. Recently there has been significant effort applied to the development of techniques to enable MEMS devices to be fabricated from fused silica, which has beneficial material properties for inertial sensors applications. In particular, fused silica has a low coefficient of thermal expansion, which is of particular benefit for mechanical stability purposes. This property is a key factor in achieving very low levels of thermo-elastic damping in resonator devices, and allows resonator structures to be realized which have very high Q values when compared to the more typical silicon versions. The high Q value is particularly beneficial for Coriolis gyroscopes as it is a key factor driving many of the Bias errors which scale as $1/Q$ or $1/Q2$.

MEMS devices are typically fabricated from silicon substrates using Deep Reactive Ion Etching (DRIE) techniques. Recently there has been significant effort to develop similar techniques to fabricate MEMS devices from fused silica substrates based on the use of Inductively Coupled Plasmas (ICP). These have focused on developing techniques to etch high aspect ratio trenches, with smooth sidewalls, through fused silica substrates. Many of the targeted applications require substrates of greater than 100 μm thickness to be used.

However, ICP etching of fused silica presents several drawbacks. For example, fused silica is a highly resilient material and hence etch rates, which are typically up to 1 μm/minute, tend to be significantly slower than for silicon, where rates of greater than 20 μm/minute have been achieved in some applications. The trench aspect ratios currently achievable through etching of fused silica are also somewhat lower than for silicon. Currently, trench aspect ratios of between 5:1 and 10:1 are achievable for fused silica, while for silicon, maximum values can exceed 100:1.

ICP etching of fused silica is also limited by the properties of compatible masking materials, which provide only limited selectivity when compared to those used for DRIE of silicon. Due to the low selectivity, thicker masking layers are required for fused silica than for silicon etching at equivalent etch depths. This reduced selectivity becomes increasingly problematic as the etch depth requirement increases, as the thickness of the masking layer is required to be a significant proportion of the thickness of the fused silica substrate that is required to be etched. This can cause issues due to the large mismatch in the coefficient of thermal expansion (c.t.e.) between the fused silica, which has a c.t.e. of—0.5 ppm, and (typically metallic) mask materials, which have significantly higher c.t.e.'s (e.g. the c.t.e of Al is ~21-24 ppm). The large mismatch may induce significant stress in the metallized wafer, giving rise to a consequent wafer bow that can cause problems, for instance, when clamping the wafer.

ICP etching of fused silica may also result in re-deposition of sputtered silica material which can cause etch defects. Deposits of this material may also accumulate on the side walls of the etch chamber which can degrade performance and necessitates frequent cleaning. This limits the equipment availability and hence the overall production efficiency of fused silica devices.

There is therefore a requirement for a processing technique which can produce narrow, high aspect ratio, vertical trenches in fused silica wafers enabling planar resonator structures to be produced, which avoids issues with wafer bowing and has high productivity.

The present disclosure relates to improved processing techniques for fused silica, in order to form fused silica MEMS devices.

SUMMARY

According to a first aspect of this disclosure, there is provided a method for forming a MEMS structure for an inertial sensor from fused silica, the method comprising: depositing a conductive layer on one or more selected regions of a first surface of a fused silica substrate; illuminating areas of the fused silica substrate with laser radiation in a pattern, the pattern defining features of the MEMS structure for an inertial sensor; depositing a masking layer at least on the one or more selected regions of the first surface of the fused silica substrate where the conductive layer has been deposited, wherein the masking layer is deposited such that the illuminated areas of the fused silica substrate remain exposed; and performing a first etch of the exposed areas of the fused silica substrate so as to selectively etch the pattern defining features of the MEMS structure for an inertial sensor.

In accordance with this disclosure, illumination of a fused silica substrate with laser radiation allows illuminated areas of the fused silica substrate to be selectively etched in a pattern to define physical features of the MEMS structure. This allows fabrication of MEMS structures for inertial sensors from fused silica, with physical features having higher aspect ratios than are achievable using conventional techniques such as deep reactive ion etching (DRIE) and inductively coupled plasma (ICP) etching. MEMS structures formed from fused silica exhibit significantly lower levels of thermo-elastic damping, enabling much higher Q values to be achieved than those of similar MEMS structures formed from silicon. The features of the MEMS structure may include an interdigitated structure or a vibrating structure for use in inertial measurements.

The method described herein can also advantageously be applied to produce MEMS die shapes which cannot be readily achieved by other means. This can be achieved by altering the pattern illuminated by the laser such that it defines a die shape in the fused silica substrate surrounding the MEMS structure. For example, in the case that the MEMS structure is an annular resonator, the optimum shape to effectively eliminate asymmetry arising due to the MEMS die shape is a circular die which matches the symmetry of the annular resonator. Thus in some examples the pattern further defines a circular MEMS die in the fused silica substrate surrounding the MEMS structure. In such examples, performing the first etch of the exposed areas of the fused silica substrate selectively etches the pattern defining features of the MEMS structure for an inertial sensor and the circular MEMS die.

The laser parameters may be selected such that illumination with laser radiation modifies the material structure of the fused silica substrate without causing ablation of the fused silica substrate. Modification of the material structure caused by the laser may comprise the formation of small cracks in the fused silica substrate in the areas in which it has been subjected to laser radiation. The formation of small cracks facilitates etching of the fused silica substrate, causing increased etch rates. The amount by which the etch rate is increased may be dependent on the alignment of cracks. In order to achieve uniform etch rates, it is preferable that the cracks are randomly aligned. Such randomly aligned cracks may be formed when circularly polarized light is used. Thus, in some examples, the laser radiation comprises circularly polarised light.

In some examples, performing a first etch comprises at least partially submerging the fused silica substrate in a chemical etchant. In some examples, the chemical etchant is KOH or HF. However, in some examples, performing the first etch may comprise performing ultrasonic machining of the fused silica substrate. In some examples, performing the first etch may comprise powder blasting the fused silica substrate.

In some examples, the method further comprises performing a second etch, wherein the duration of the second etch is significantly shorter than the first etch. Performing a second etch of short duration may reduce surface roughness on surfaces that may occur as a result of the first etch. Thus, by performing a short second etch in HF etch after the first etch, more uniform surfaces may be achieved than is possible after the first etch alone. Performing a second etch may be particularly beneficial if the first etch is performed using KOH, or if the first etch is performed using ultrasonic machining or powder blasting of the fused silica substrate, as these methods may lead to high levels of surface roughness.

In some examples, the laser may be scanned over the fused silica substrate by adjusting its position and/or focal length to modify the material structure of the fused silica substrate in the required pattern. Thus, in some examples illuminating the fused silica substrate with laser radiation in a pattern comprises adjusting the focal point of a laser.

The laser may be selected such that it has a wavelength at which fused silica is optically transparent. The focal point of the laser may therefore be adjusted such that it lies within the fused silica substrate. In this way, the pattern may be selected such that it defines features throughout the depth of the fused silica substrate. Thus, in some examples, the pattern defines features of the MEMS structure for an inertial sensor in three dimensions. The features may be physical features of the MEMS structure that provide for inertial sensing function.

In some examples, the features of the MEMS structure may define a moving structure for an inertial sensor, such as interdigitated fingers, or a vibrating structure for an inertial sensor, e.g. a cylinder, tuning fork, disc, ring, etc. In one set of examples, the features include a planar vibrating structure, a rigid external mount, and a plurality of compliant supports extending between the planar vibrating structure and the rigid external mount to support the planar vibrating structure in an XY plane. The planar vibrating structure may be an annular resonator, for example.

In some examples, the conductive layer may include alignment elements formed on the fused silica substrate, which may be used to accurately align the laser pattern to ensure that conductive elements formed in the conductive layer are aligned with the underlying features of the fused silica substrate as defined by the pattern. Thus, in some examples, the conductive layer comprises at least one alignment element, and the method further comprises the step of aligning a source of laser radiation using the at least one alignment element.

In some examples, the MEMS structure may be bonded to a substrate to support the MEMS structure, for example in a packaged inertial sensor. The method may, in some examples further comprise bonding the MEMS structure to a supporting substrate. In such examples, the substrate may be selected in order to minimise differences in the coefficient of thermal expansion between the MEMS structure and the substrate. This may be achieved by forming the substrate from the same material as the MEMS structure. Hence, in some examples, the supporting substrate comprises fused silica.

In some examples, the MEMS structure and a supporting structure may be formed from a common fused silica substrate, provided that the common fused silica substrate has appropriate dimensions. In such examples, the method may further comprise forming an underlying supporting structure for the MEMS structure, for example by etching the common fused silica substrate. The supporting structure may be formed such that additional components can be positioned in the vicinity of the MEMS structure, for example in an inertial sensor package. The supporting structure may be formed such that components may be positioned beneath selected areas of the MEMS structure, e.g. by forming projections underneath the fused silica substrate. Thus, in some examples, the method further comprises forming a supporting structure from the fused silica substrate extending in a direction substantially perpendicular to the first surface of the fused silica substrate.

By depositing the masking layer over the conductive layer in selected regions, there is created conductive regions which overlie the features of the MEMS structure. Furthermore, the masking layer may be shaped so that these selected regions define one or more conductive elements on the first surface of the fused silica substrate. The alignment elements mentioned above may be formed as part of the conductive elements. The conductive elements may be intended to provide any desired function in the inertial sensor. For example, one or more conductive elements may form conductive tracks to enable electrical connections in an inertial sensor. For example, one or more conductive elements may form transducers to enable sensing and/or driving operations in an inertial sensor.

In order for the MEMS structure to effectively function in an inertial sensor, transducers may be formed on a surface of the MEMS structure to allow it to perform sensing and/or driving functions. In use in an inertial sensor, the transducers may be configured to apply an electrical excitation and/or to sense a motion of the MEMS structure. Thus, in some examples, the step of depositing the conductive layer may comprise forming transducers in the conductive layer of the MEMS structure to enable (e.g. at least) sensing operations in an inertial sensor. This may be achieved e.g. by suitable patterning of the conductive layer on the selected regions.

In some examples, the MEMS structure is configured for use in an inertial sensor employing inductive sensing. In such examples, the transducers formed on the MEMS structure may comprise conductive tracking, such that the transducers can be used to sense changes in voltage induced by motion of the transducers, and hence the MEMS structure in a magnetic field. In such examples, forming the transducers in the conductive layer may comprise forming conductive tracking on at least one of the selected regions of the first surface of the fused silica substrate.

In some examples, the MEMS structure is configured for use in an inertial sensor employing piezoelectric sensing and forcing. In such examples, the transducers formed on the MEMS structure may comprise piezoelectric material, such that a charge flow can be induced in some of the transducers in response to their deformation. When the transducers comprise piezoelectric material, charge flow may be induced by motion of the transducers, allowing motion of the MEMS structure to be detected. The MEMS structure is also configured to apply forcing when a voltage is applied to separate piezoelectric transducers. Thus, in some examples, depositing the conductive layer further comprises depositing a piezoelectric material layer and forming the transducers in the conductive layer comprises forming piezoelectric electrodes on at least one of the selected regions of the first surface of the fused silica substrate. The piezoelectric electrodes may be configured for use as sensing and/or forcing electrodes.

According to a second aspect of this disclosure, there is provided a MEMS structure for an inertial sensor, the MEMS structure comprising: a fused silica substrate comprising a planar vibrating structure, a rigid mount, and a plurality of compliant supports extending between the planar vibrating structure and the rigid mount to support the planar vibrating structure in an XY plane, thereby allowing the planar vibrating structure to oscillate in the XY plane relative to the rigid mount; and a conductive layer, formed on one or more selected regions of a first surface of the fused silica substrate. The conductive layer defines a plurality of transducers arranged on the planar vibrating structure and electrically connected in the XY plane, in use, to apply an in-plane electrical excitation to the planar vibrating structure such that it oscillates in the XY plane in response to the electrical excitation, and to sense in-plane.

The MEMS structure disclosed herein is advantageously formed from fused silica, which provides improved material properties when compared to comparable devices formed from silicon. Fused silica has as a lower coefficient of thermal expansion than silicon, and can hence provide improved mechanical stability. The fused silica MEMS structures disclosed herein exhibit significantly lower levels of thermo-elastic damping, enabling much higher Q values to be achieved than those of similar MEMS structures formed from silicon. By forming a conductive layer on the fused silica substrate, transducers can be defined in an in-plane arrangement, allowing the MEMS structure to be formed in a single layer, and from a single fused silica substrate. This in-plane arrangement differs from prior art fused silica MEMS structures, such as that described in WO2017/025752, which describes a capacitive gyroscope comprising a first set of electrode tracks formed on a planar ring of a first layer, which are interdigitated with a second set of axially offset electrodes formed on the facing surface of a second layer, spaced from the ring by a gap in an axial direction normal to the planar ring structure.

The nature of the transducers arranged to apply an electrical excitation and to sense a motion of the MEMS structure may be dependent on the design of the inertial sensor in which the MEMS structure is employed. For example, the transducers may be formed differently if the MEMS structure is for an inertial sensor employing inductive sensing than if the MEMS structure is for an inertial sensor employing piezoelectric sensing and forcing.

Thus, in some examples, the MEMS structure is configured for use in an inertial sensor employing inductive sensing. In such examples, the transducers may comprise conductive tracking formed on a surface of the planar vibrating structure. For example, the transducers may comprise a set of inductive electrodes formed on the surface of the planar vibrating structure in the XY plane. In such examples, the transducers may be used to sense changes in voltage induced by motion of the transducers, and hence the MEMS structure, in a magnetic field.

In some examples, the MEMS structure is configured for use in an inertial sensor employing piezoelectric sensing and forcing. In such examples, the conductive layer may comprise a first conductive layer and a second piezoelectric material layer. For example, the transducers may comprise a set of piezoelectric electrodes formed on the surface of the planar vibrating structure in the XY plane. In some such examples, the MEMS structure may further comprise a third conductive layer, preferably arranged on an opposite side of the second piezoelectric material layer from the first conductive layer (i.e. the piezoelectric material layer sandwiched between two other conductive (e.g. metal) layers). The first conductive layer, second piezoelectric material layer, and third conductive layer may be formed in a stacked arrangement on the fused silica substrate. In examples comprising a piezoelectric material layer, a charge flow can be induced in some of the transducers formed on the MEMS structure in response to their deformation. Such charge flow may be induced by motion of the transducers, allowing motion of the MEMS structure to be detected in an inertial sensor comprising the MEMS structure. In such examples, the transducers of the MEMS structure may be configured to apply forcing when a voltage is applied to separate piezoelectric transducers.

In some examples, the MEMS structure further comprises at least one alignment element formed in the conductive layer for use during a selective laser etching process to define features of the MEMS structure including the planar vibrating structure, rigid external mount, and plurality of compliant supports. In such examples, the alignment elements may be used to accurately align a laser pattern to ensure that the regions in which the conductive layer is formed are correctly aligned with the features of the MEMS structure. For example, the alignment elements may be used to ensure that the transducers defined in the conductive layer are arranged on the planar vibrating structure, rather than elsewhere on the fused silica substrate.

In some examples, the MEMS structure may be bonded to a substrate to support the MEMS structure, for example in a packaged inertial sensor. Thus, in some examples, the MEMS structure may comprise a supporting substrate bonded to the MEMS structure. In such examples, the supporting substrate may be selected in order to minimise differences in the coefficient of thermal expansion between the MEMS structure and the substrate. This may be achieved by forming the substrate from the same material as the MEMS structure. Hence, in some examples, the supporting substrate comprises fused silica.

As it is not possible to adhere layers of fused silica using anodic bonding, alternative bonding processes must be employed in examples in which the MEMS structure is bonded to a supporting substrate. Hence, in some examples, the supporting substrate is bonded to the MEMS structure by an intervening layer of adhesive material. In some such examples, the intervening layer of adhesive material may comprise an epoxy bonding layer.

In some examples, both the MEMS structure and a supporting structure may be formed from a common fused silica substrate, provided that the common fused silica substrate has appropriate dimensions. In such examples, a single common fused silica substrate may be processed to form both the fused silica substrate comprising the planar vibrating structure, and an underlying supporting structure. The supporting structure may be formed such that additional components can be more easily positioned in the vicinity of the MEMS structure, for example in an inertial sensor package. For example, in an inductive type inertial sensor, space may be required to accommodate one or more parts of a magnetic circuit, such as an annular upper pole piece, a disc shaped lower pole piece, or a disc shaped permanent magnet. The supporting structure may therefore be formed such that there is a space below the XY plane of the MEMS structure in which additional components can be placed, for example by forming projections underneath the fused silica substrate. Thus, in some examples, the fused silica substrate comprises a supporting structure formed from the fused silica substrate and extending out of the XY plane from the mount to define a space below the XY plane.

The planar vibrating structure may take a variety of forms depending on the design of the inertial sensor in which the MEMS structure is employed. In some examples, such as in the case that the MEMS sensor is for an angular rate sensor, the planar vibrating structure may comprise an annular resonator. In alternative examples, in which the MEMS structure is for an accelerometer, the planar vibrating structure may comprise a suspended proof mass comprising a plurality of protrusions, interdigitated with a plurality of corresponding protrusions extending from the mount.

In the case that the MEMS structure for an inertial sensor is an annular resonator, the optimum shape to effectively eliminate asymmetry arising due to the MEMS die shape is a circular die which matches the symmetry of the annular resonator. Thus, in some examples the fused silica substrate may be circular. Such a circular fused silica substrate may be formed using the methods disclosed above. In some such examples, the supporting substrate and/or supporting structure may also be circular to further reduce stress within the MEMS structure.

According to another aspect of the disclosure, an inductive inertial sensor is provided, comprising a MEMS structure as described above, wherein the transducers comprise conductive tracking formed on a surface of the planar vibrating structure, and further comprising a magnetic circuit, configured to produce a magnetic field perpendicular to the XY plane of the planar vibrating structure.

In some examples the inductive inertial sensor comprises a plurality of electrical connections in the XY plane to the plurality of transducers.

According to another aspect of the disclosure, a piezoelectric inertial sensor is provided comprising a MEMS structure as described above, wherein the transducers comprise a set of piezoelectric electrodes formed on the surface of the planar vibrating structure in the XY plane.

In some examples the piezoelectric inertial sensor comprises a plurality of electrical connections in the XY plane to the plurality of transducers.

In at least some examples, the inertial sensor comprises a plurality of electrical connections in the XY plane to a plurality of non-capacitive transducers.

Features of any aspect or example described herein may, wherever appropriate, be applied to any other aspect or example described herein. Where reference is made to different examples or sets of examples, it should be understood that these are not necessarily distinct but may overlap.

BRIEF DESCRIPTION OF THE DRAWINGS

One or more non-limiting examples will now be described with reference to the accompanying drawings, in which.

DETAILED DESCRIPTION

Figure 1:
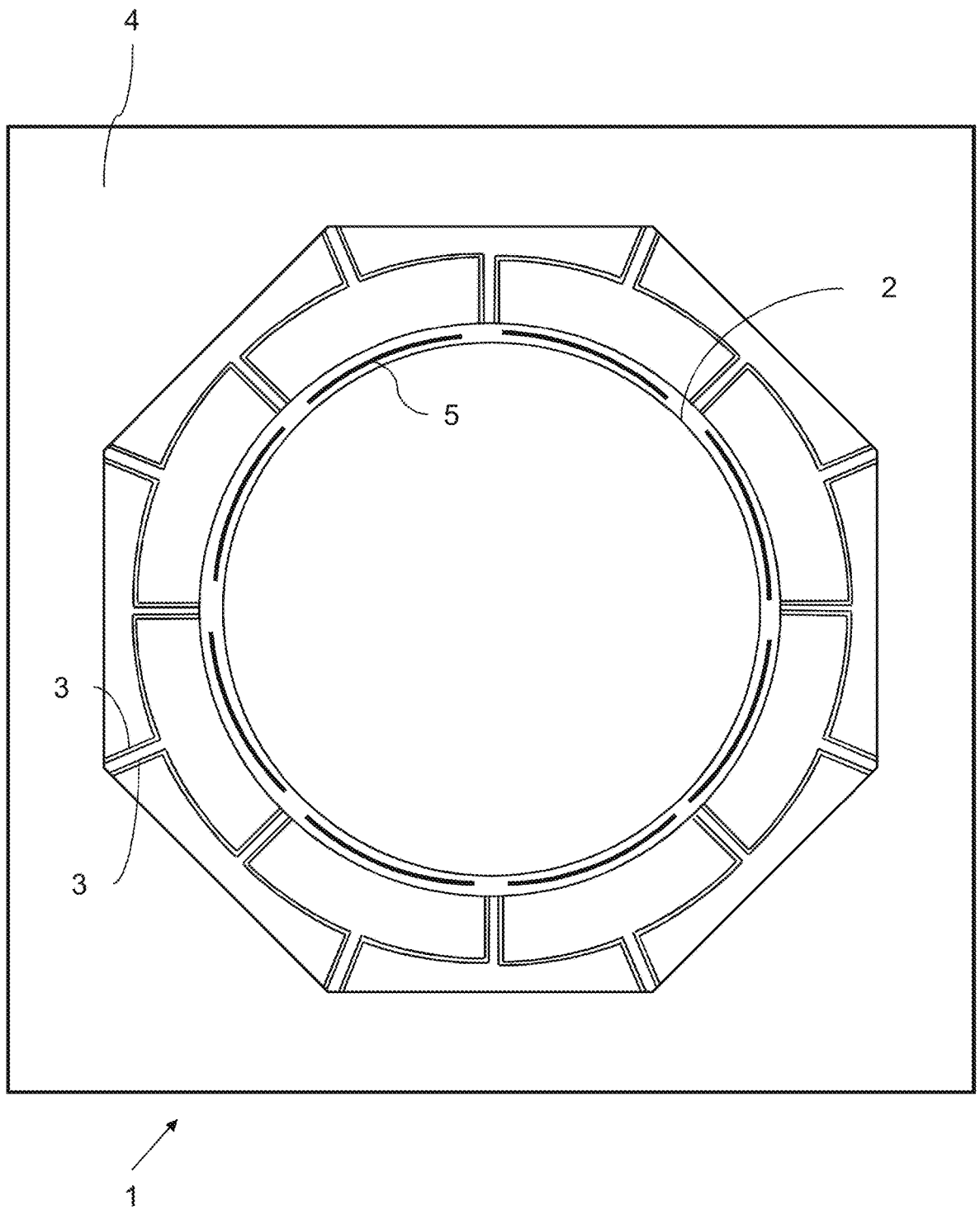
FIG. 1 schematically illustrates a silicon layer of a ring MEMS structure as known from the prior art.

FIG. 1 shows a planar view of the silicon layer 1 of a ring-shaped MEMS structure for an inertial sensor as known from the prior art. The silicon layer 1 of the ring-shaped MEMS structure comprises a planar vibrating structure in the form of a ring resonator structure 2, on the upper surface of which a plurality of transducers 5, comprising conductive tracking, are formed at specific locations. The ring resonator structure 2 is flexibly attached by means of a plurality of compliant leg structures 3, to a rigid mount 4.

Figure 2:
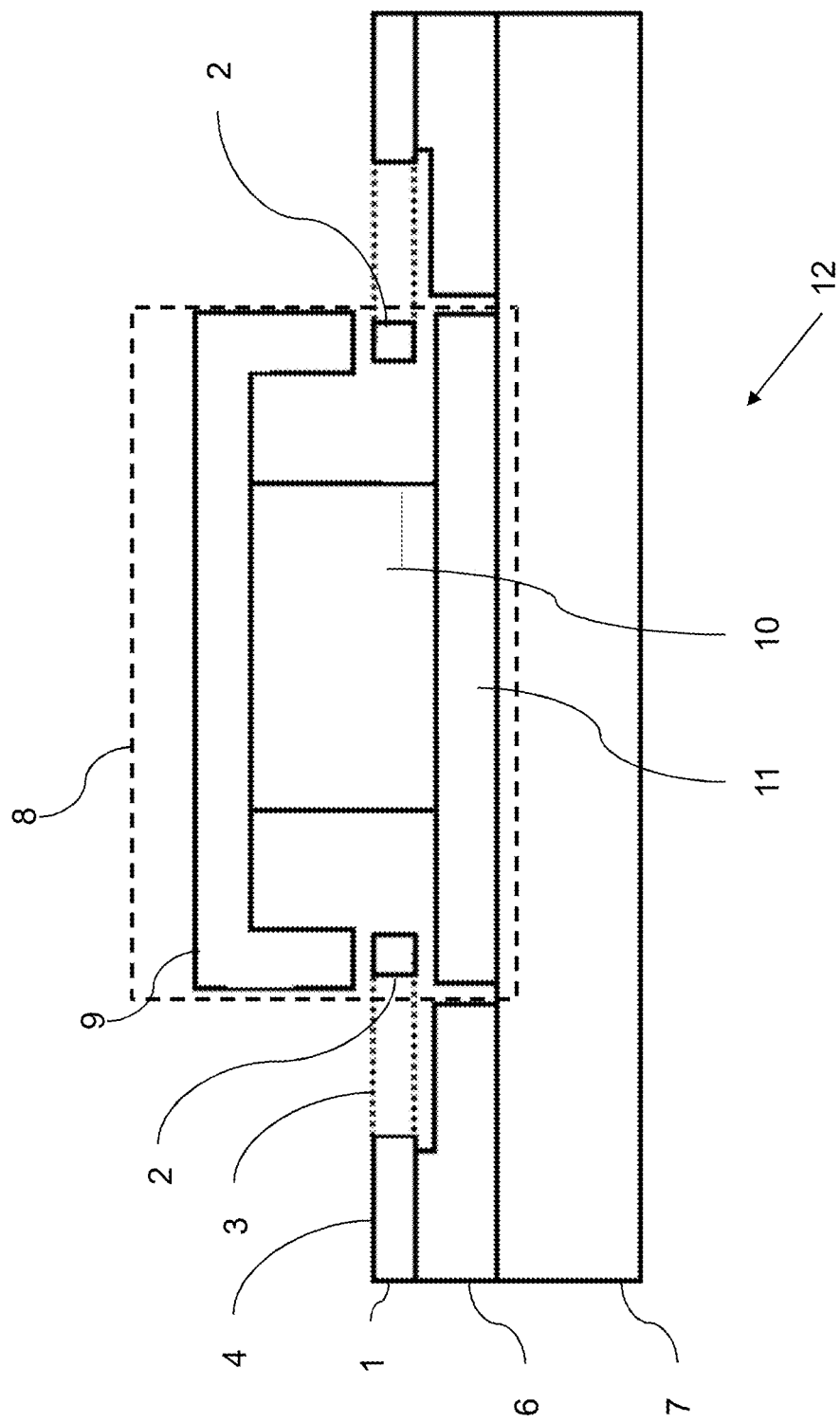
FIG. 2 schematically illustrates a fully assembled inductive gyroscope according to the prior art.

A schematic cross-sectional view of a fully assembled inductive gyroscope 12 including the silicon layer 1 is shown in FIG. 2. The rigid mount 4 of the silicon layer 1 is bonded to a pedestal structure 6, formed from glass, which is in turn bonded to a support structure 7, also formed from glass. A magnetic circuit 8, comprising a disc shaped lower pole piece 11, a disc shaped permanent magnet 10, and an annular upper pole piece 9, is also bonded to the support structure 7.

The magnetic circuit 8 is arranged such that a magnetic field is provided which is focused around the ring resonator structure 2, perpendicular to the plane of the ring. An alternating current signal is applied to the transducers 5 on the upper surface of specific segments of the ring resonator structure 2 to apply Lorentz forces to control the vibrational motion of the ring resonator structure 2. The motion of the section of the ring resonator structure 2 in the magnetic field induces signals indicative of motion in the remaining ring segments of the ring resonator structure 2.

By applying an alternating current signal at specific segments of the ring resonator structure 2, the ring resonator structure 2 can be made to vibrate in a primary mode of vibration. When a rotation at an angular rate S2 is applied around an axis perpendicular to the plane of the ring resonator structure 2, Coriolis forces couple energy into a secondary mode of vibration, with the amplitude of the vibration being proportional to the applied angular rate. The resulting motion of the ring resonator structure 2 in the magnetic field induces a signal in the remaining ring segments, which can be used to determine the applied rotation rate.

Figure 3:
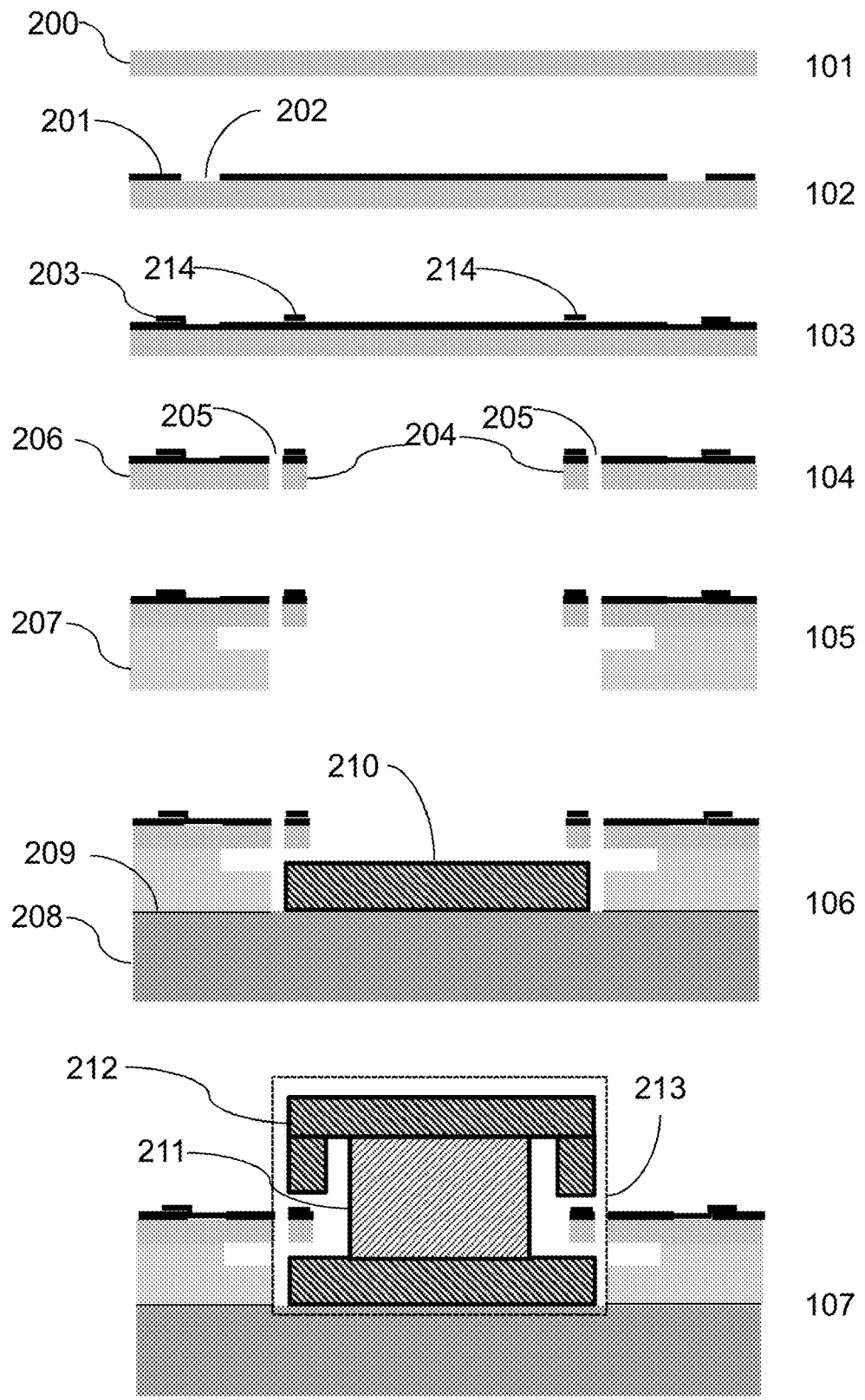
FIG. 3 shows an exemplary fabrication process for forming an inductive gyroscope from silicon according to the prior art.

A typical fabrication process for forming a fully assembled inductive gyroscope 12 from a silicon substrate, according to the prior art, is illustrated in FIG. 3.

The fabrication process starts, in step 101, with a silicon substrate 200 having a thickness ~100 µm. In step 102, a thin insulating oxide layer 201 is formed on the upper surface of the silicon substrate 200. The thin insulating oxide layer 201 comprises holes 202 provided in specific locations to allow subsequent grounding of the conductive silicon substrate 200 beneath.

Having formed the thin insulating oxide layer 201, a thin metal layer 203 is then deposited over the thin insulating oxide layer 201 and holes 202 in step 103. The thin metal layer 203 is patterned to form conductive elements, such as transducers 214 and electrical connections for the completed device. A photoresist layer (not shown) is then deposited over the thin metal layer 203 in step 104, and is patterned to define the areas to be subsequently etched by means of a Deep Reactive Ion Etch (DRIE) process. In this step, the silicon substrate 200 is temporarily bonded to a support wafer (not shown in FIG. 3) before an etch is performed to define the MEMS structure of the inductive gyroscope 12. This etch step forms narrow (10 µm to 30 µm), high aspect ratio trenches in the areas 205 (typically between 10:1 and 3:1) through the full thickness of the silicon substrate 200 to define a ring resonator structure 204, a rigid external frame 206, and a plurality of compliant supports (not shown in FIG. 3), attaching the ring resonator structure 204 to the rigid external frame 206.

The silicon layer 200 is subsequently removed from the support wafer, at which point the silicon sections between the compliant supports, and the sections inside the ring resonator structure 204 are unsupported and are therefore removed.

In step 105, after the photoresist layer is removed, the silicon substrate 200 is anodically bonded to a pedestal structure 207, configured such that cavities are provided under the positions of the ring resonator 204 and the compliant supports, and such that a through-hole is provided for placement of the components of a magnetic circuit 213.

In step 106, a support structure 208, with a disc shaped lower pole piece 210 mounted to its upper surface, is bonded by means of a thin epoxy layer 209, to the pedestal structure 207 and the previously anodically bonded silicon substrate 200 such that the disc shaped lower pole piece 210 is centrally aligned in the hole in the pedestal structure 207 under the silicon ring resonator structure 204 and compliant supports.

In step 107, the remaining components of the magnetic circuit 213, comprising a disc shaped permanent magnet 211 and an annular upper pole piece 212, are subsequently glue bonded to complete the device assembly to complete the inductive gyroscope 12, equivalent to that shown in FIG. 2.

The prior art process shown in FIG. 3 is significantly more challenging to implement in the fabrication of MEMS structures from fused silica than from silicon, as it requires the use of thick metallic masking layers in order to achieve features with a sufficiently high aspect ratio. The application of such layers may cause significant stress in fused silica substrates, leading to wafer bowing. In addition, the process shown in FIG. 3 cannot be directly applied to fused silica as modifications to the process are required due to differences in material properties between fused silica and silicon. For example, fused silica, unlike silicon, is an insulating material, and hence the formation of an oxide layer is not required. Furthermore, the anodic bonding process used to bond the silicon substrate 200 and the glass pedestal structure 207 together, which relies of the presence of Na+ ions in the glass, cannot be applied when using fused silica.

However, the Applicants have recognised that alternative processing steps to those shown in FIG. 3 can be used to fabricate MEMS structures for inertial sensors from fused silica with comparable aspect ratios to those achieved using DRIE of silicon. Forming such structures from fused silica provides the advantage that they exhibit significantly lower levels of thermo-elastic damping, enabling much higher Q values to be achieved than those of similar MEMS structures formed from silicon.

In particular, the Applicants have developed a selective laser etching (SLE) process that can be used to fabricate fused silica MEMS structures for inertial sensors with higher aspect ratios than are presently achievable for fused silica using conventional techniques such as deep reactive ion etching (DRIE) and inductively coupled plasma (ICP) etching.

The SLE process described herein involves focusing an ultra-short pulse laser beam on selected areas of a fused silica substrate, which can then be preferentially removed using an etch solution. As will be described in the following, by scanning the laser over a fused silica substrate, features of a MEMS structure can be defined by the illumination pattern, with the fused silica substrate being subsequently removed selectively with a chemical etchant. For example, the laser can be scanned in a pattern to define trenches around the edges of the ring and leg features of a resonator structure, which can subsequently be removed with a chemical etchant to leave behind the defined features in three dimensions. Fused silica is transparent at the wavelength of the laser used for this process, however, due to the high intensity, the laser radiation is absorbed at the focal point due to non-linear absorption processes. This induces rapid internal heating and subsequent quenching, in a highly localised area within the material. This results in a permanent modification of the fused silica material over the focal spot size of a several microns.

The parameters of the laser used are selected such that modification of the material structure, rather than ablation, of the fused silica substrate takes place. Two types of material modification are observed. The first of these is a change in the material structure associated with an increase in the density in the vicinity of the focal area of the laser. The second is the creation of small cracks in the same area. As a result of these changes, fused silica in the areas exposed to the laser treatment becomes susceptible to etching in a suitable etchant such as a HF or KOH solution at a significantly enhanced etch rate compared to the pristine, unmodified bulk fused silica material. The comparative etch rates (selectivity) of treated to untreated fused silica may be as high as 100:1 for HF and >1000:1 for KOH.

The cracks formed by the laser are beneficial as they provide ready access for the etchants to penetrate into the areas to be etched. However, the properties of the cracks are dependent on the polarization of the laser. When using a linearly polarized laser, the orientation of the cracks will tend to be perpendicular to the polarization direction and the laser beam direction. For circular polarization the crack orientation is more random in nature. Penetration of the etchant is primarily dependent on the nature of the cracks. In the context of MEMS devices for inertial sensors, the alignment of cracks in any particular lateral direction can be detrimental, as the direction of the trench changes around the resonator structure. It is therefore preferable to use circularly polarized light, which produces randomly aligned cracks. Such randomly aligned cracks result in uniform etching in all directions and therefore the resultant trench widths, and hence resonator dimensions, are consistent across the entire structure.

Processes for the formation of MEMS devices for inertial sensors from fused silica will now be described with reference to FIGS. 4-8.

Figure 4:
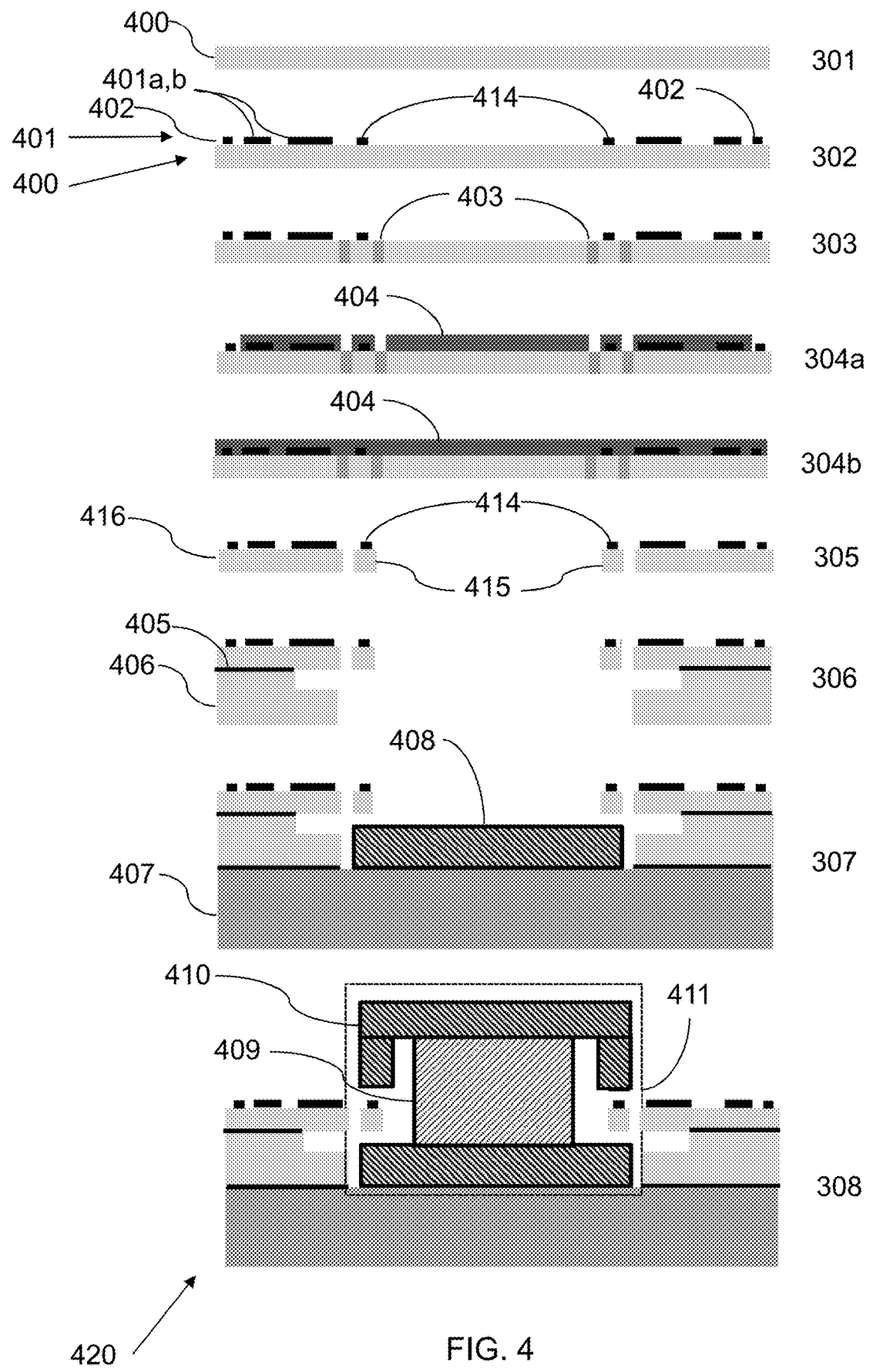
FIG. 4 shows a fabrication process for forming an inductive gyroscope from fused silica according to a first example of the present disclosure.

FIG. 4 shows a process flow diagram of a method of fabrication of a fused silica inductive gyroscope 420 according to a first example of the present disclosure.

The process starts, in step 301, with a fused silica substrate 400 having a thickness ~100 μm.

In step 302, a conductive layer comprising a conductive e.g. metal layer 401 is deposited in selected regions on the surface of the fused silica substrate 400 in a manner equivalent to that shown in step 103 of FIG. 3 for a conventional silicon device, such that conductive elements are formed in the metal layer 401 including transducers 414 and electrical connections 401a, 401b for the completed device. However, as noted above, as fused silica is an insulator, the surface oxide layer formation step 102 used in the fabrication of conventional silicon devices is not required. In addition, in contrast to the metallization process performed on the silicon oxide surface layer, the conductive elements of the metal layer 401 formed on the fused silica substrate 400 includes alignment elements 402, formed on the external frame area surrounding the location in which a planar vibrating structure in the form of a ring resonator structure will be formed, the function of which is described below.

Accurate alignment between the conductive elements formed in the metal layer 401, such as the transducers 414, and the features of the MEMS structure to be etched out, such as a ring resonator, is critical. Alignment elements 402 serve to accurately align the laser pattern to that of the metal layer 401. Said alignment elements 402 are particularly useful for the batch fabrication of MEMS structures, as although the conductive elements in the metal layer 401 are patterned using a wafer level process, laser processing may be performed serially for multiple devices on the same wafer. Providing alignment elements 402 on each MEMS structure formed on a wafer allows for optimum laser alignment between the ring resonator structures of each MEMS structure, and the conductive elements 401a, 401b, 414 of the metallic layer 401.

Using the alignment elements 402, a laser is aligned to the other conductive elements 401a, 401b, 414 deposited in the metal layer 401, and is scanned, in step 303, over the surface and through the depth of the fused silica substrate 400 to define the areas 403 in which trenches are to be subsequently etched. These trenches define features of a ring resonator 415 and compliant legs (not shown in FIG. 4) attaching the ring resonator 415 to a mount (i.e. external frame) 416 defined by the remainder of the fused silica substrate 400. As described above, the laser radiation is absorbed at the focal point during scanning, causing modification of the fused silica substrate 400 at the focal point. By scanning the laser appropriately, the areas 403 in which trenches are to be formed around the edges of the ring and leg structures can therefore be defined and made more susceptible to etching.

Prior to etching the fused silica substrate 400 to preferentially remove material that has been subjected to laser radiation, the conductive elements 401a, 401b, 402, 414 formed in the metal layer 401 must be protected by a masking layer from the etchant used to remove the laser processed fused silica from the trench areas 403. This may be achieved by one of two processes, outlined below.

In a first process, shown in step 304a, a KOH and HF resistant protective coating material 404 such as SX AR-PC 5000/41, manufactured by Allresist, is applied to the surface of the fused silica substrate 400 and metal layer 401 as a masking layer. A resist layer is thus deposited and patterned, such that the metal layer 401 is protected and the areas 403 in which trenches are to be etched are exposed as shown in step 304a. A first mask is used to selectively expose the alignment elements 402 of the metal layer 401, while leaving the remainder of the fused silica substrate 400 and metal layer 401 protected by the protective coating material 404. The alignment elements 402 are then used to align a second mask, which is used to expose the protective coating material 404 in a pattern defining the laser treated areas that are to be etched.

In an alternative process, the top of the fused silica substrate 400 is completely protected by a protective coating material 404 as a single masking layer, leaving the lower side of the fused silica substrate 400 exposed to the etchant, as shown in step 304b. The conductive elements 401a, 401b, 402, 414 formed in the metal layer 401 are therefore not etched and the SLE processed material may be removed using single sided etching. Using this approach, it is not necessary to expose the alignment elements 402 or to pattern the layer of protective coating material 404, thus eliminating some process steps. The disadvantage of this process is that the etch will therefore take longer to complete. However, due to the high selectivity, near vertical trench wall profiles may still be achieved.

Regardless of which of steps 304a, 304b is used, in step 305 trenches are etched, and material is removed from the areas 403 (seen in step 303) in which trenches are formed, using a suitable etchant such as HF or KOH. After the etch is complete, the protective coating material 404 is removed. These trenches therefore define the physical features of the MEMS structure, in this example of a ring resonator 415 and compliant legs (not shown in FIG. 4) attaching the ring resonator 415 to the mount 416 defined by the remainder of the fused silica substrate 400. As seen in step 305, the transducers 414 that were aligned in position in step 302 are now arranged on the upper surface of the ring resonator 415.

In step 306, the fused silica substrate 400 is bonded, using an epoxy layer 405, to a supporting substrate, referred to in the following as pedestal 406, which may be formed from glass. As noted above, the anodic bonding process used in the formation of MEMS devices from silicon substrates, which relies of the presence of Na+ ions in the glass, cannot be applied when using fused silica. Instead, the fused silica substrate 400 is conveniently bonded using the same epoxy bonding process that is used to bond the glass pedestal structure and glass support structures of the silicon MEMS structure, as shown in step 106 in FIG. 3.

This involves applying a thin epoxy layer 405 between the lower surface of the fused silica substrate 400 and the upper surface of the pedestal 406. Pedestal layers used in prior art MEMS devices formed from silicon are typically made from Tempax glass, which has a similar coefficient of thermal expansion (c.t.e.) to that of silicon. However, fused silica has a significantly lower c.t.e. than silicon, which is less well matched to that of a Tempax layer. The pedestal 406 shown in FIG. 4 may therefore be formed from fused silica, instead of glass, in order to eliminate stress and strain arising due to mismatches in expansion rates over temperature.

In step 307, the pedestal 406 to which the fused silica substrate 400 is bonded, is itself epoxy bonded to a lower supporting substrate 407, to which a disc shaped lower pole piece 408 is attached, in a manner equivalent to that described in relation to step 106 of the prior art device fabrication process shown in FIG. 3. In this way, the fused silica substrate 400 is supported by a supporting substrate comprising the pedestal 406 and the lower support 407. The lower supporting substrate 407 may be formed from glass, or may be fabricated from fused silica in order to reduce stress and strain arising due to mismatches in expansion rates over temperature between the two layers of the supporting substrate 406, 407.

In step 308, a permanent magnet 409 and an annular upper pole piece 410, which form a magnetic circuit 411 when combined with the disc shaped lower pole piece 408, are assembled in a manner equivalent to that described in relation to step 107 of the silicon device fabrication process shown in FIG. 3, in order to form an inductive gyroscope 420.

The Applicant has recognised that if processed correctly, a supporting substrate and MEMS structure may be formed from a single fused silica substrate of appropriate dimensions. This advantageously eliminates the requirement for epoxy bonding between a MEMS device layer and one or more supporting substrate layers.

Such formation of a MEMS structure including its own supporting structure from a common fused silica substrate is described below with reference to the process flow diagram shown in FIG. 5, which describes a second example of a method of fabricating a fused silica MEMS structure for an inertial sensor.

Figure 5:
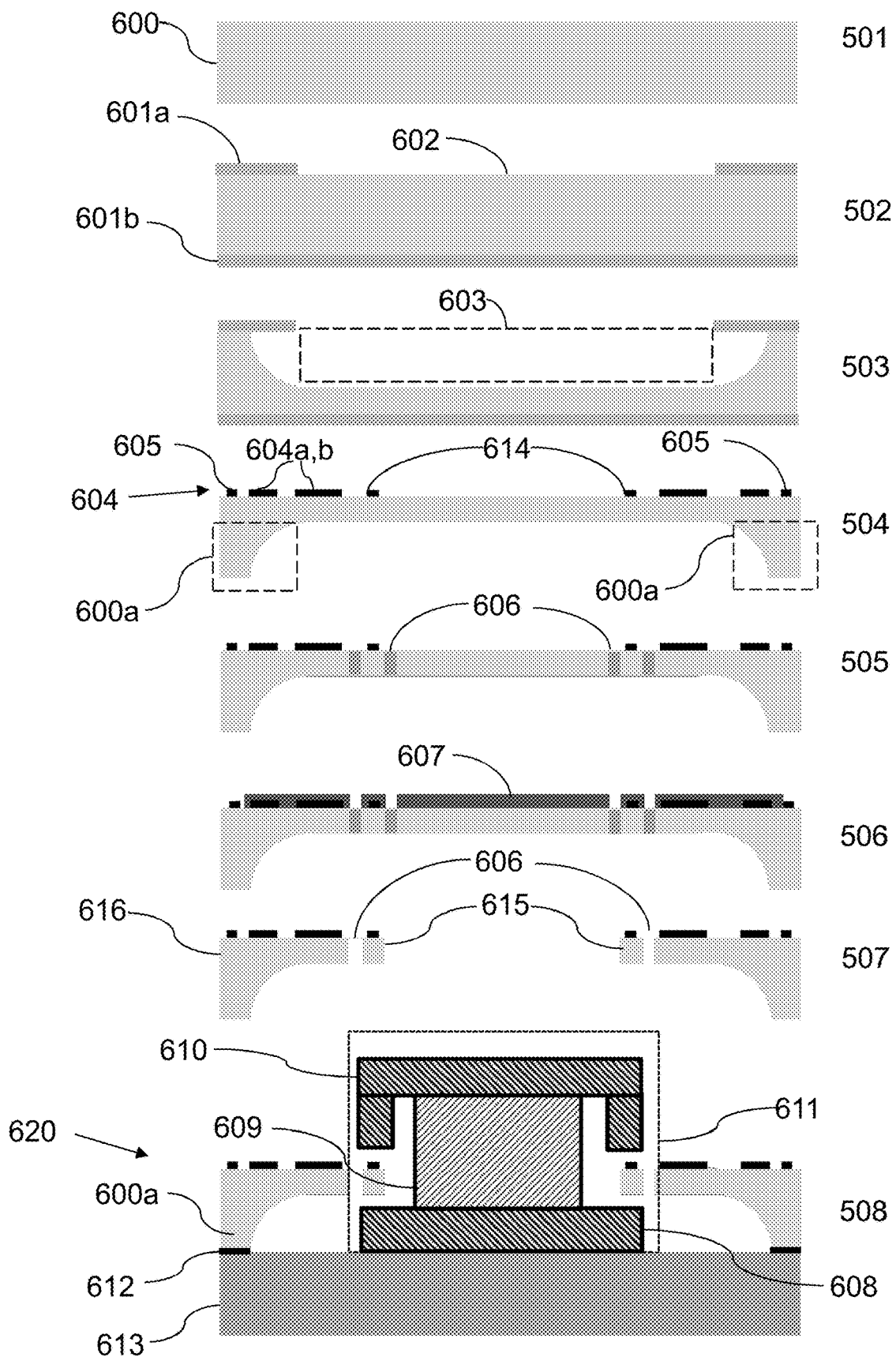
FIG. 5 shows a fabrication process for forming an inductive gyroscope from fused silica according to a second example of the present disclosure.

FIG. 5 shows a process flow diagram for the fabrication of a fused silica inductive gyroscope 620 in which a supporting structure and MEMS structure are formed from a single fused silica substrate 600.

The process starts, in step 501, with a fused silica substrate 600 having a thickness ~400 μm. This corresponds to the combined thickness of the fused silica substrate in which a resonator structure will be formed, and an underlying supporting structure, which have thicknesses of ~100 μm and ~300 μm respectively.

In step 502, a mask layer 601a, which may be, for example, polysilicon or a layer of chrome over gold, is deposited onto the backside surface of the fused silica substrate 600. The front side of the fused silica substrate 600 is similarly protected with a mask layer 601b, but no specific patterning is required.

In step 503, the fused silica substrate 600 is etched in an HF solution which uniformly etches the exposed areas of the fused silica substrate 600 to form a circular cavity 603. The duration of the etch is selected such that the circular cavity 603 has a depth of—300 μm, such that the remainder of the fused silica substrate 600 comprises a 100 μm thick layer from which a MEMS structure for an inertial sensor can subsequently be formed.

HF etching is isotropic and thus the resultant circular cavity 603 in the fused silica substrate 600 has a smooth base with curved side-walls. The diameter of the circular cavity 603 is therefore larger towards the upper surface of the fused silica substrate 600. The etch rate of the circular cavity 603 may, in some examples, be significantly enhanced by applying the same SLE processing as used for fabrication of the trenches in the areas 403, shown in FIG. 4. Specifically, prior to etching the circular cavity 603 in step 503, the area in which the circular cavity 603 is to be formed may be illuminated using the SLE laser, making it more susceptible to subsequent etching. This may enable the formation of vertical, rather than curved, cavity sidewalls, however significant additional laser processing time is required to achieve this.

Alternative techniques which may be used to form the circular cavity 603 include ultrasonic machining and powder blasting. These processes may result in less uniform cavities with rougher surfaces which are prone to some surface damage, which is undesirable where the fused silica surface is part of a resonator structure. However, the Applicant has recognised that problems resulting from high surface roughness may be addressed by performing a short HF etch after the circular cavity 603 is formed to remove the surface material and reduce the roughness and damaged areas. As performing a second short etch in this way may result in more uniform surfaces when compared to a first HF or KOH etch alone, this step may advantageously be performed after any of the etch steps described herein to improve surface quality of the etched features. A second etch may be particularly beneficial if the first etch is performed using KOH, or if alternative etching processes, such as ultrasonic machining or powder blasting are employed, as these methods may lead to higher surface roughness than is achieved using HF etching.

The mask layers 601a, 601b are then removed to leave a pre-cavitated substrate 600, supported by a supporting structure 600a (which is annular in this example) extending from the areas of the substrate that will ultimately form the mount of the MEMS structure. The combination of the pre-cavitated substrate 600 and the supporting structure 600a is similar in structure to the combination of the pedestal 406 and fused silica substrate 400 shown in FIG. 4.

Subsequent metal deposition, laser treatment and trench formation processes are carried out in steps 504 to 508, and proceed as previously described in relation to FIG. 4, on the top surface of the pre-cavitated fused silica substrate 600.

Thus, in step 504, a conductive e.g. metal layer 604 is deposited and patterned on the surface of the fused silica substrate 600 in a manner equivalent to that described in relation to step 302 shown in FIG. 4. As described in relation to FIG. 4, the metal layer 604 is deposited to form various conductive elements, including transducers 614 and electrical connections 604a,b for the completed device. The metal layer 604 also includes alignment elements 605 formed on the external mount (e.g. frame) area surrounding the area in which a planar vibrating structure in the form of a ring resonator structure will be formed.

In step 505, a laser is aligned to the patterning of the metal layer 604 using the alignment elements 605, and is scanned over the surface of the silica substrate 600 to define areas 606 in which trenches are to be formed causing modification of the material structure of the fused silica substrate 600 in the areas subjected to laser radiation. The trenches formed in areas 606 define a ring resonator 615 and compliant legs (not shown in FIG. 5) attaching the ring resonator 615 to a mount 616 defined by the remainder of the fused silica substrate 600. The result is seen in step 507.

Prior to etching the fused silica substrate 600 to preferentially remove material that has been subjected to laser radiation, the metal layer 604 is protected from the etchant used to remove the laser processed fused silica layer 600 from the trench areas.

As described above, this may be achieved using one of two processes, equivalent to those shown in steps 304a and 304b of FIG. 4.

In the example shown in step 506 of FIG. 5, a KOH and HF resistant protective coating material 607 such as SX AR-PC 5000/41, manufactured by Allresist, is applied to the surface of the fused silica substrate 600 and metal layer 604. A masking layer is thus deposited and patterned, such that the metal layer 604 deposited on selected regions is protected and the areas 606 in which trenches are to be etched are exposed as shown in step 506. A first mask is used to selectively expose the alignment elements 605 of the metal layer 604, while leaving the remainder of the fused silica substrate 600 and metal layer 604 protected by the protective coating material 607. The alignment elements 605 are then used to align a second mask, which is used to expose the protective coating material 607 to a pattern defining the laser treated areas that are to be etched.

Although not shown in FIG. 5, it will be appreciated that a single sided etch process, equivalent to that shown in step 304b in FIG. 4, may alternatively be applied.

In step 507, the trenches are etched in the areas 606 using a suitable etchant such as HF or KOH, after which the resist material is removed.

In step 508, the supporting structure 600a of the fused silica substrate 600 is bonded, using an epoxy layer 612, to a supporting substrate 613 to which a disc shaped lower pole piece 608 is attached, in a manner equivalent to that described in relation to step 307 of the process of the first example shown in FIG. 4. The supporting substrate 613 may also be fabricated from fused silica in order to reduce stress and strain arising due to mismatches in expansion rates over temperature between the fused silica substrate 600 and the supporting substrate 613. This is followed by the assembly of a permanent magnet 609 and an annular upper pole piece 610 to form a magnetic circuit 611 in a manner equivalent to that described in relation to step 308 of process shown in FIG. 4, in order to form the inductive gyroscope 620.

FIGS. 4 and 5 demonstrate that the SLE process described herein is applicable to the fabrication of an inductive gyroscope from fused silica. However, it will be appreciated that the similar processing using SLE can also be used to fabricate MEMS structure for other types of inertial sensor devices. An example of this is illustrated in FIGS. 6A and 6B, which show processing steps that can be used to form a piezoelectric gyroscope from fused silica by employing SLE processing.

Figure 6A:
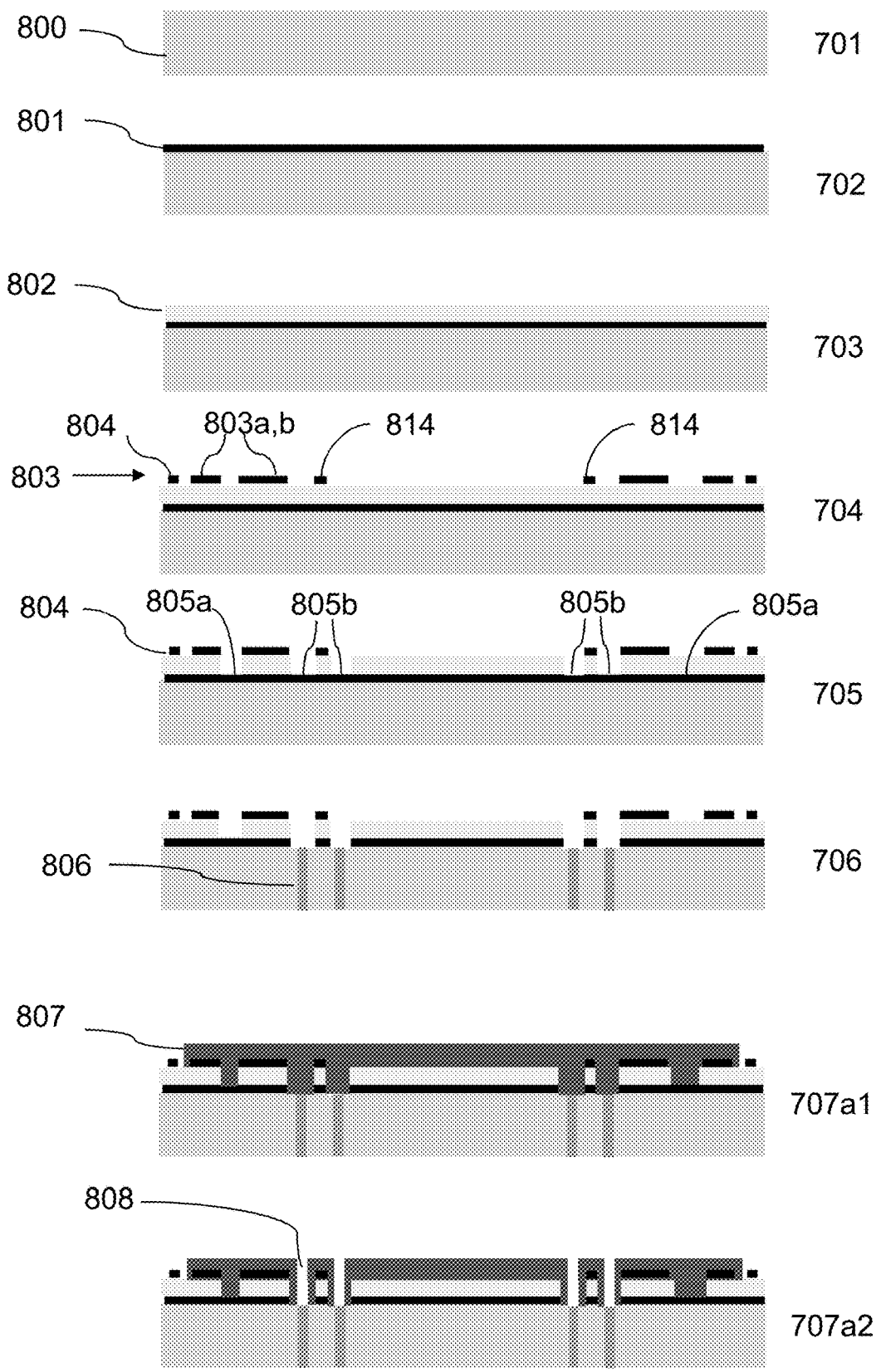
FIGS. 6A and 6B show a fabrication process for forming a piezoelectric gyroscope from fused silica according to a third example of the present disclosure.
Figure 6B:
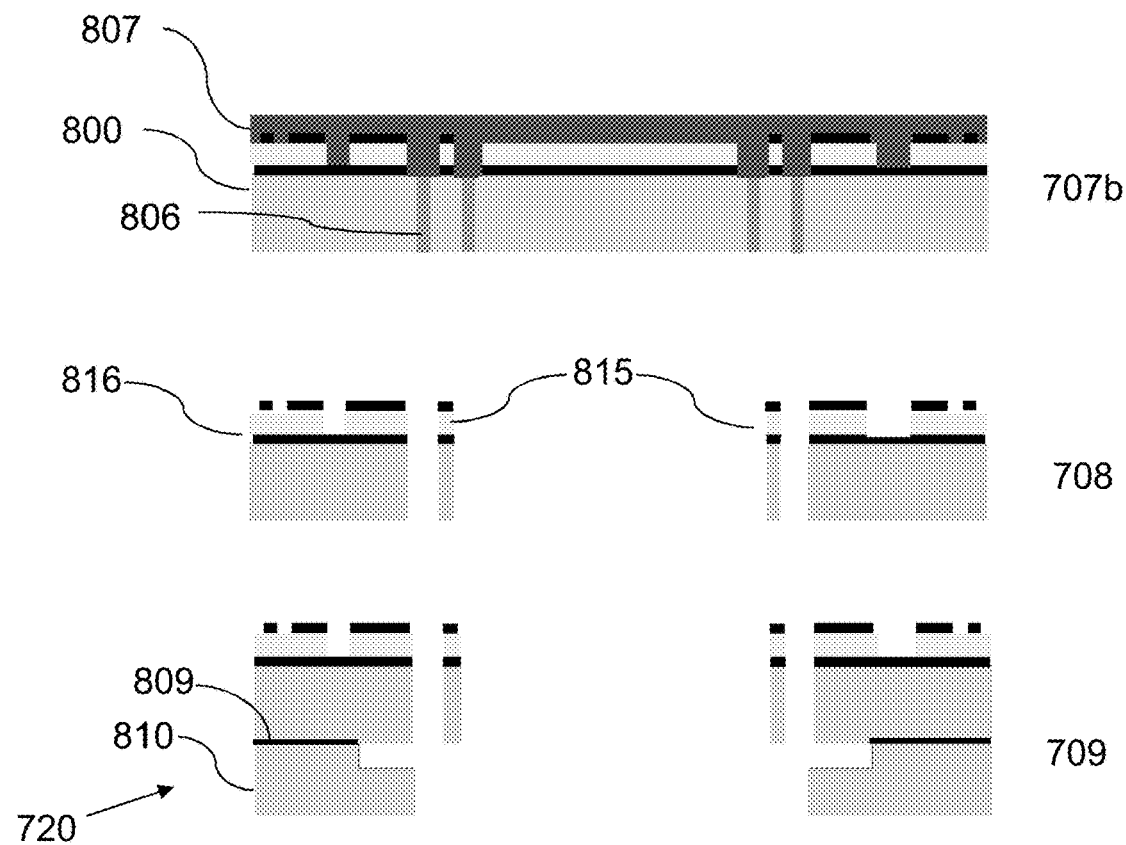

FIGS. 6A and 6B show a process flow diagram of a method of fabrication of a fused silica piezoelectric gyroscope 720 according to a third example of the present disclosure.

The process starts, in step 701, with a fused silica substrate 800 having a thickness ~100 μm.

In step 702, a first conductive e.g. metal layer 801, comprising 10 nm of Titanium and 100 nm of Platinum, is deposited the upper surface of the fused silica substrate 800. A thin layer 802 (of approximately 3 μm thickness) of a piezoelectric film such as lead zirconate titanate (PZT) is then deposited on top of the metal layer 801 in step 703.

In step 704, a second metal layer 803, which may comprise, for example, 100 nm of Platinum, is deposited and patterned on the surface of the PZT film 802, and processed in in a manner equivalent to that shown in step 302 shown in FIG. 4. The first metal layer 801, the PZT layer 802 and the second metal layer 803 together form a conductive layer deposited on top of the fused silica substrate 800. The second metal layer 803 is patterned to form various conductive elements, including alignment elements 804, conductive tracking 803a,b and transducers 814—as shown in step 704. In this example, the transducers 814 combine with the underlying piezoelectric film 802 to form piezoelectric electrodes on the surface of the fused silica substrate 800.

In step 705, the PZT layer 802 is selectively removed in the areas 805b, beneath which trenches in the fused silica layer 800 will ultimately be formed, as well as in areas 805a to allow electrical contact to be made to the bottom metal electrode layer 801. To achieve this, a photoresist layer (not shown) is deposited over the PZT layer 802, and is exposed in a first pattern to define a first set of areas (i.e. areas 805a, 805b) in which the PZT layer is to be etched by means of a Reactive Ion Etch (RIE) process. An etching process is then performed to form narrow trenches through the PZT layer 802 in the areas 805a and 805b. This exposes the bottom metal electrode in the areas 805a for subsequent electrical contact, and prepares the areas 805b for further etching. The photoresist layer is then exposed in a second pattern to define a second set of areas (i.e. areas 805b) in which the bottom metal electrode layer 801 is to be etched by means of a Reactive Ion Etch process. The bottom metal electrode layer 801 is then etched in the areas 805b using RIE to expose the underlying fused silica substrate 800 such that trenches can be subsequently etched through the fused silica substrate 800 in the areas 806. It will be appreciated that the first and second patterns through which the photoresist layer (not shown) is exposed in step 705 are not the same as the pattern used for laser illumination in the next step.

In step 706, a laser is scanned over the areas 806 in which trenches in the fused silica layer 800 are to be formed, in order to make these areas susceptible to chemical etching. This is achieved by aligning the laser to the pattern formed in the second metal layer 803 using the alignment elements 804, scanning the laser over the surface and through the depth of the fused silica substrate 800 to define the areas 806 in which trenches are to be subsequently etched to define features of the MEMS structure, such as a planar vibrating structure in the form of a ring resonator 815 and compliant legs (not shown in FIG. 6A) attaching the ring resonator 815 to a mount 816 defined by the remainder of the fused silica substrate 800 (as seen in step 708).

Before such an etch step can take place, the features formed in the second metal layer 803 and the PZT layer 802 must be protected from the etchant used to remove the laser processed fused silica from the areas 806 in which trenches are to be formed. As described above in relation to the fabrication of inductive gyroscopes, this may be achieved by one of two processes, outlined below.

In a first process, shown in steps 707a1 and 707a2, a KOH and HF resistant protective coating material 807 such as SX AR-PC 5000/41, manufactured by Allresist, is applied to the surface of the fused silica substrate 800 and the metal and PZT layers formed on its surface. This masking layer 807 is patterned, such that the underlying metal and PZT layers are protected and the areas 808 in which trenches are to be etched are exposed. A first mask is used to expose the alignment elements 804 of the second metal layer 803, while leaving the remainder of the fused silica substrate 800 and second metal layer 803 protected by the protective coating material 807. The alignment elements 804 are then used to align a second mask, which is used to expose the protective coating material 807 to a pattern defining the laser treated areas 808 that are to be etched (as shown in step 707a2).

In an alternative process, shown in step 707b, the top of the fused silica substrate 800 is completely masked by the protective coating material 807, leaving the lower side of the fused silica substrate 800 exposed to the etchant. The features formed in the metal and PZT layers are therefore not etched and the SLE processed material may be removed using single sided etching of the fused silica substrate 800. Using this approach, it is not necessary to expose the alignment elements 804 or to pattern the layer of protective coating material 807, thus eliminating some process steps. However, as described above, etching in this way will take longer to complete than using the process shown in steps 707a1 and 707a2.

Regardless of which of steps 707a1-707a2, or 707b, is used, trenches through the fused silica substrate 800 are subsequently etched in step 708, and material is removed from the areas 806, using a suitable etchant such as HF or KOH. After this etch step is complete, the protective coating material 807 is removed.

In step 709, the fused silica substrate 800 is bonded, using an epoxy layer 809, to a supporting substrate, referred to in the following as pedestal 810. The epoxy layer 809 is placed between the lower surface of the fused silica substrate 800 and the upper surface of the pedestal 810. As noted above in relation to the inductive gyroscopes shown in FIGS. 4 and 5, the pedestal 810 shown may be formed from fused silica in order to eliminate stress and strain arising due to mismatches in expansion rates over temperature.

The SLE process described herein can also be used to provide additional advantageous options for the fabrication of MEMS structures for inertial sensors from fused silica.

For the circular resonator structures in the resonator devices described above, the square shape of a typical diced MEMS chip can adversely influence performance due to the differential perturbation of the two operating cos 2θ modes. This perturbation arises due to the unavoidable stress and strain which couples from the supporting substrate(s) and external packaging, into the resonator due to differences in the thermal expansion coefficients between the various materials. The square shape of the diced chip is particularly detrimental as it may induce asymmetric stresses which differentially effect the cos 2θ mode parameters. In prior art sensors fabricated from silicon, countermeasures may be employed to minimise such effects. For example, U.S. Pat. No. 9,709,401 describes the use of an octagonally shaped glass pedestal which requires additional process steps for fabrication.

The Applicant has recognised that the SLE processes described above can advantageously be applied to produce MEMS die shapes which cannot be readily achieved by other means. Specifically, the Applicant has recognised that the laser used for selective laser etching can be scanned to produce complex trench arrangements defining a range of MEMS die shapes. This can be done during the same process step that produces the MEMS structures for inertial sensing, and hence no additional process steps are required.

In the case of a ring resonator structure, the optimum shape to effectively eliminate the asymmetry arising due to the MEMS die shape is a circular die which matches the symmetry of the circular resonator.

Figure 7:
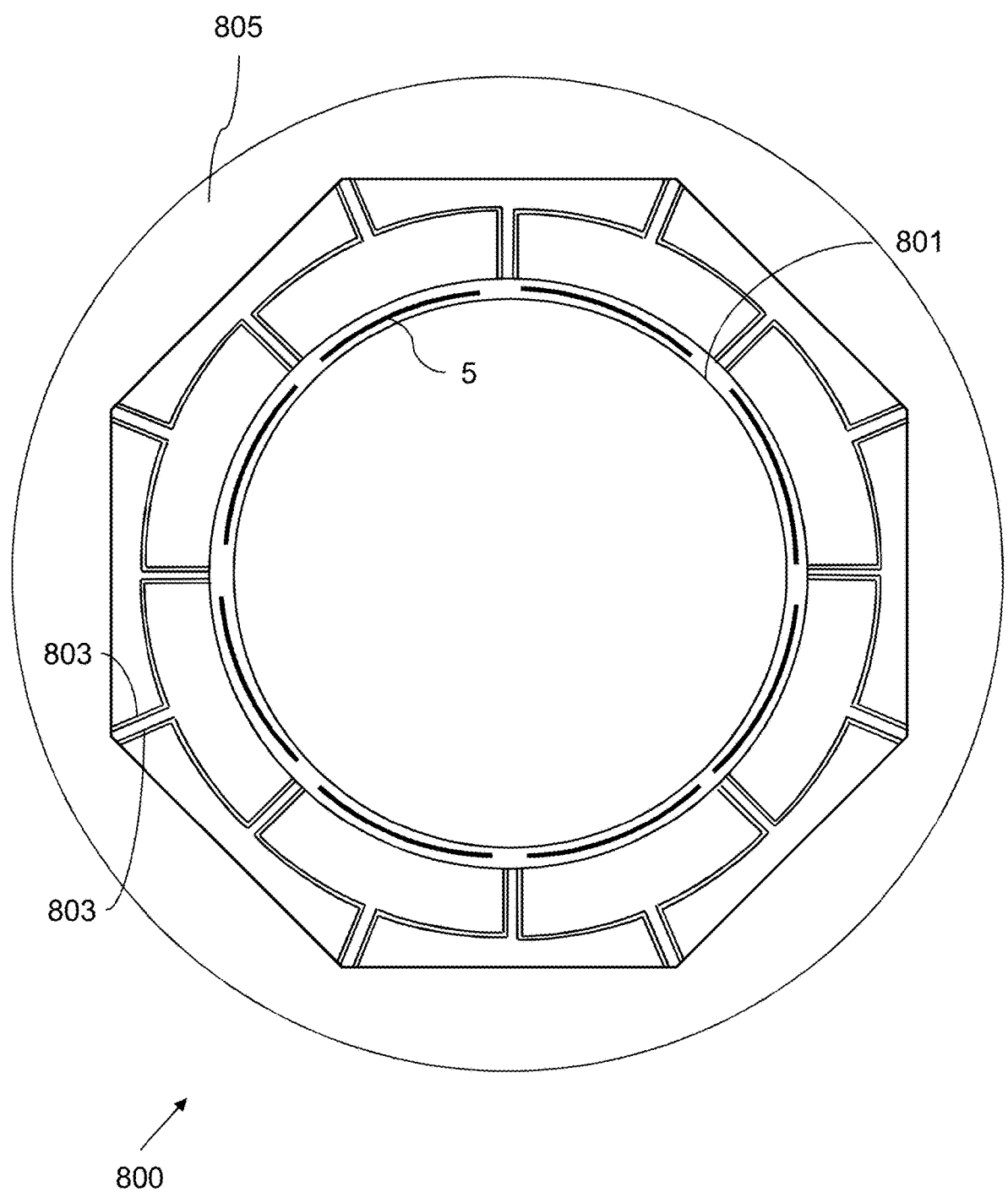
FIG. 7 schematically illustrates a fused silica layer of a ring MEMS structure according to an example of the present disclosure.

An example of such a circular MEMS die on which a resonator is formed is illustrated in FIG. 7, which shows a planar view of a fused silica layer 800 of a MEMS structure for an inertial sensor according to an example of the present disclosure. The MEMS structure shown in FIG. 7 comprises a ring resonator 801 which is flexibly attached by means of a multiplicity of compliant leg structures 803, to a rigid circular outer frame-like mount 805 formed from fused silica, supporting the resonator structure 801.

In the case that a plurality of MEMS devices such as the ring resonator 801 are formed on a single wafer, it is beneficial to maintain the MEMS device on a single wafer until immediately prior to assembly in a final package. This may be achieved by forming incomplete circular trenches around each die, as illustrated in FIG. 8.

Figure 8:
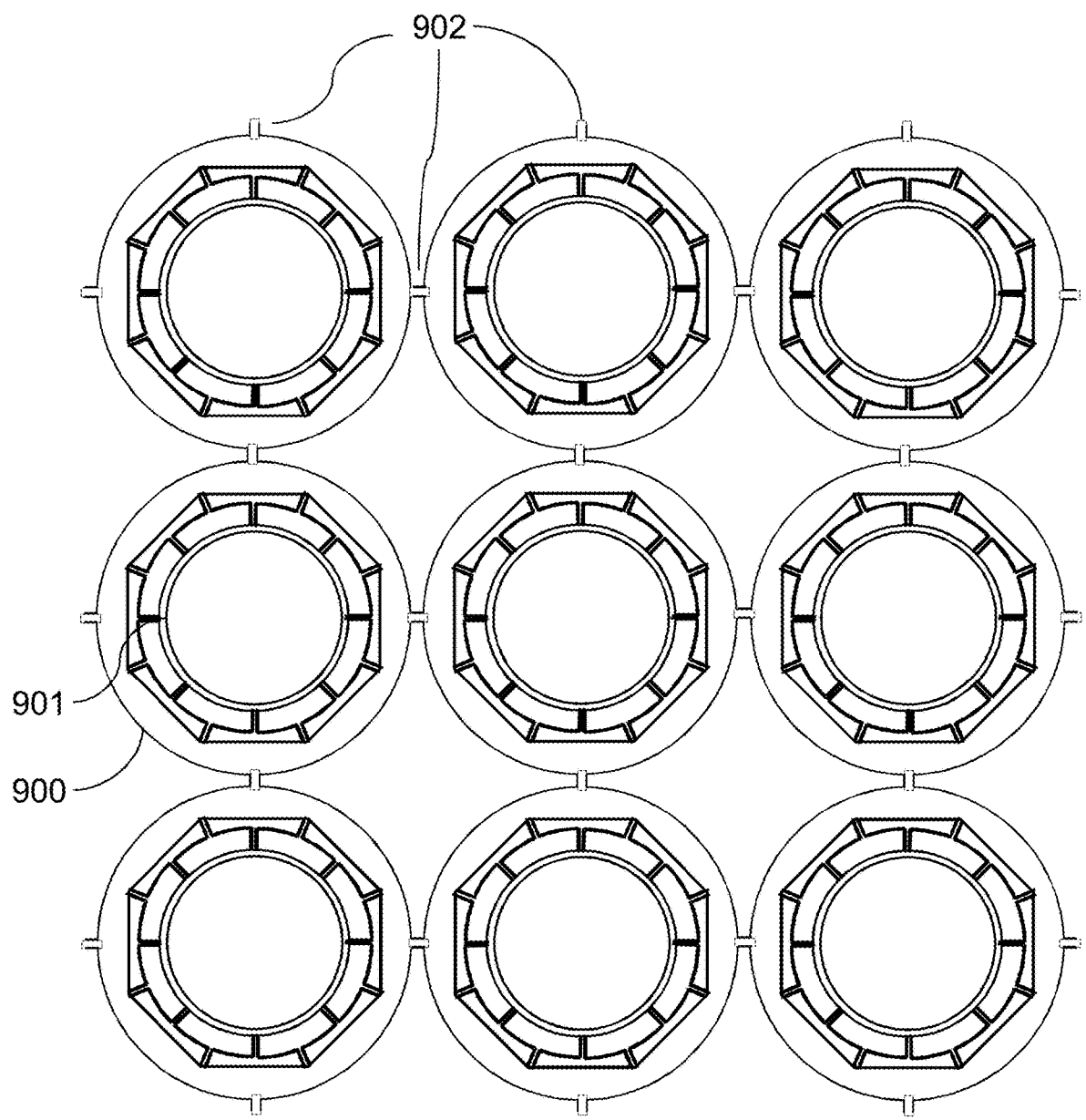
FIG. 8 schematically illustrates part of a wafer of fused silica MEMS with connecting structures according to an example of the present disclosure.

FIG. 8 shows a plurality of circular dies 900, on which ring resonators 901 are formed, have been formed from a single fused silica wafer. The circular dies 900 are connected by short, unetched sections 902 formed as a result of etching incomplete circular trenches around each of the MEMS structures 901. The circular dies 900 are thus each connected by short, unetched, sections 902 at 90° angular separation.

The unetched sections 902 can be conventionally released in a final wafer dicing step to separate individual die for packaging. This will cause some degradation in the circular symmetry however the residual undesirable asymmetry will be substantially reduced from that for the square die.

It will be appreciated by those skilled in the art that the disclosure has been illustrated by describing one or more specific examples thereof, but is not limited to these aspects; many variations and modifications are possible, within the scope of the accompanying claims.

The invention claimed is:

1. A method for forming a MEMS structure for an inertial sensor from fused silica, the method comprising:
   depositing a conductive layer on one or more selected regions of a first surface of a fused silica substrate;
   illuminating areas of the fused silica substrate with laser radiation in a pattern, the pattern defining features of the MEMS structure for an inertial sensor;
   depositing a masking layer at least on the one or more selected regions of the first surface of the fused silica substrate where the conductive layer has been deposited, wherein the masking layer is deposited such that the illuminated areas of the fused silica substrate remain exposed; and
   performing a first etch of the exposed areas of the fused silica substrate so as to selectively etch the pattern defining features of the MEMS structure for an inertial sensor.

2. The method of claim 1, wherein the laser radiation comprises circularly polarised light.

3. The method of claim 1, further comprising performing a second etch, wherein the duration of the second etch is significantly shorter than the first etch.

4. The method of claim 1, wherein the pattern defines features of the MEMS structure for an inertial sensor in three dimensions.

5. The method of claim 1, wherein the conductive layer comprises at least one alignment element; and wherein the method further comprises the step of aligning a source of laser radiation using the at least one alignment element.

6. The method of claim 1, further comprising bonding the MEMS structure to a supporting substrate comprising fused silica.

7. The method of claim 1, wherein depositing the conductive layer further comprises forming transducers in the conductive layer of the MEMS structure to enable sensing operations in an inertial sensor.

* * * * *